United States Patent
Chiu et al.

(10) Patent No.: US 6,194,240 B1
(45) Date of Patent: Feb. 27, 2001

(54) METHOD FOR FABRICATION OF WAVELENGTH SELECTIVE ELECTRO-OPTIC GRATING FOR DFB/DBR LASERS

(75) Inventors: Tien-Heng Chiu, Spotswood; Michael D. Williams, Freehold, both of NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 0 days.

(21) Appl. No.: 08/171,126

(22) Filed: Dec. 21, 1993

(51) Int. Cl.[7] ............................................. H01L 21/00
(52) U.S. Cl. ........................ 438/31; 438/29; 385/14; 385/130
(58) Field of Search .......................... 437/129; 372/20, 372/46, 50, 96; 148/DIG. 95; 438/31, 29; 385/14, 130

(56) References Cited

U.S. PATENT DOCUMENTS

| | | | |
|---|---|---|---|
| 4,701,995 | * | 10/1987 | Dolan et al. ........................ 437/129 |
| 4,706,251 | * | 11/1987 | Rona ..................................... 372/20 |
| 4,716,132 | * | 12/1987 | Hirata .................................. 437/129 |
| 4,748,132 | * | 5/1988 | Fukuzawa et al. .................. 437/129 |
| 4,796,274 | * | 1/1989 | Akiba et al. . |
| 4,843,032 | * | 6/1989 | Tokuda et al. ...................... 437/129 |
| 4,845,725 | * | 7/1989 | Welch et al. ......................... 372/46 |
| 4,885,753 | * | 12/1989 | Okai et al. ............................ 372/50 |
| 4,904,045 | * | 2/1990 | Alferness et al. . |
| 5,079,185 | * | 1/1992 | Kagawa et al. ..................... 437/129 |
| 5,143,864 | * | 9/1992 | Takemoto et al. .................. 437/129 |
| 5,145,792 | * | 9/1992 | Hirata .................................. 437/129 |
| 5,155,777 | * | 10/1992 | Angelopolous et al. . |
| 5,158,908 | * | 10/1992 | Blonder et al. ..................... 437/129 |
| 5,222,071 | * | 6/1993 | Pezeshki et al. ..................... 372/50 |
| 5,233,187 | * | 8/1993 | Sakata et al. . |
| 5,274,660 | * | 12/1993 | Abe ..................................... 437/129 |
| 5,292,685 | * | 3/1994 | Inoguchi et al. .................... 437/129 |
| 5,314,838 | * | 5/1994 | Cho et al. ............................ 437/129 |

FOREIGN PATENT DOCUMENTS

| | | | | |
|---|---|---|---|---|
| 62-296588 | * | 12/1987 | (JP) | ..................................... 437/129 |
| 2-89383 | * | 3/1990 | (JP) | ....................................... 372/20 |

OTHER PUBLICATIONS

Translation of JP 2–89383 (Tokuda).*
Zucker et al., Applied Physics Letters, vol. 52, No. 12, Mar. 21, 1988 pp. 945–947.
N.K. Dutta, AT&T Technical Journal, Jan./Feb. 1989, "III–V Device Technologies for Lightwave Applications".

* cited by examiner

*Primary Examiner*—Charles Bowers
*Assistant Examiner*—Erik Kielin

(57) ABSTRACT

A method is described for the preparation of a DFB/DBR laser which includes an electro-optic grating formed by periodically modulating the index of refraction of the cladding employed. The method involves depositing a waveguide upon a semi-insulating or doped substrate and then depositing an active layer upon the resultant structure. The active layer is subsequently selectively etched and a cladding material deposited adjacent thereto and electrically isolated therefrom. The cladding is then selectively patterned with a conductive material by photolithographic techniques to yield a grating to periodically modulate the index of refraction.

11 Claims, 3 Drawing Sheets

METHOD FOR FABRICATION OF WAVELENGTH SELECTIVE ELECTRO-OPTIC GRATING FOR DFB/DBR LASERS

FIELD OF THE INVENTION

This invention relates to a method for the preparation of DFB/DBR lasers including electro-optic gratings. More particularly, the present invention relates to a method for the preparation of a wavelength selective electro-optic grating for DFB/DBR lasers and related structures wherein etched corrugation wavelength gratings are replaced with a grating formed by periodically modulating the index of refraction of the cladding employed or the waveguide itself.

BACKGROUND OF THE INVENTION

During the past decade, rapid advances have been made in laser technology. These advances have led to the integration of lasers with other active optical elements such as detectors, optical amplifiers, optical modulators and switches on one semiconductor chip. Interconnections employed for this purpose are miniature, transparent, passive waveguides which pipe light from one device to the next and function in a manner similar to metals which carry electricity in conventional circuits. Further enhancements in this technology have been attained from advances in crystal growth and large area wafer processing.

Among the more recent developments in photonic integrated circuitry has been the corrugated-waveguide grating. The fabrication of these gratings became routine after the distributed feedback (DFB) laser was adopted worldwide as the preferred optical telecommunications source where high spectral purity is required. These gratings provide high quality on-chip resonators without encountering the restraints imposed by the usual cleaved-facet resonators employed in semiconductor lasers. Additionally, the gratings function as filters in certain receiver and amplifier applications.

Scanning electron micrographs in distributed feedback lasers reveal a corrugated interface between a higher index core material and a lower index cladding material. As a light beam propagates down such a waveguide, each bump reflects a small portion of the light. If the beam's wavelength is not close to the Bragg wavelength, all the reflections are out of phase and interfere destructively. At the Bragg wavelength, all reflections add in phase, so leading to a large cumulative reflection.

At the present time, the control of output wavelength of semiconductor lasers in distributed feedback (DFB) and tuning in distributed Bragg reflector (DBR) based lasers is achieved by means of the incorporation therein of the above-noted corrugated waveguide grating. In the DBR configuration, gratings of this type are typically installed by etching back a portion of the active layer and exposing the surface of an underlying passive waveguide. Alternatively, the grating may be installed in the substrate prior to the growth of the waveguide. In subsequent processing, an interference pattern formed by ultraviolet lasers is typically used to expose photoresist deposited on the exposed waveguide. The developed photoresist then forms the mask for etching the grating corrugation. The exposed portion of the structure is then regrown and contacts attached for operation. In the DFB configuration, the grating is usually installed prior to growth of the active layer or waveguide. This end is typically attained by using an interference pattern, as described above, to expose photoresist deposited on the exposed passive waveguide. The exposed photoresist forms a mask for etching the corrugation. The active layer is then grown over the grating and suitable contacts are added to effect operation.

SUMMARY OF THE INVENTION

In accordance with the present invention, the etched corrugation waveguide grating in the aforementioned structures is replaced with a grating formed by periodically modulating the index of refraction of either the cladding material or the waveguide. The modulated media chosen may be either bulk material or, more specifically, contain quantum well structures. In the case of the latter, it would effect large changes in the index of refraction by means of the quantum confined Stark effect or phase space absorption quenching with the application of an electric field. In the case of bulk material, current injection is the preferred mode of operation since the field induced change in the refractive index (Franz-Keldysh effect) is less efficient. The periodicity of the described device is established by means of conducting media, for example, metal, conductive polymer, etc. The conductive media is employed in the form of strip lines through which current is passed or an electric field is established through the media. Alternatively, periodicity may be established simply by the plasmon interaction of the periodically spaced conductive strip lines with the media.

BRIEF DESCRIPTION OF THE DRAWING

The invention will be more readily understood by reference to the following detailed description taken in conjunction with the accompanying drawing wherein.

DETAILED DESCRIPTION OF THE INVENTION

Figure 1:
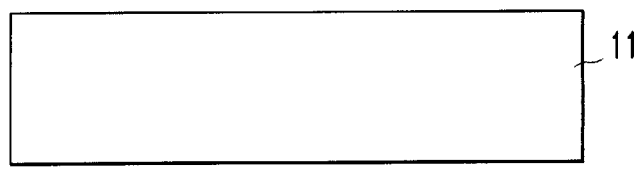
FIG. 1. is a front elevational view, in cross-section, of a semiconductor substrate suitable for use in the practice of the present invention.
Figure 2:
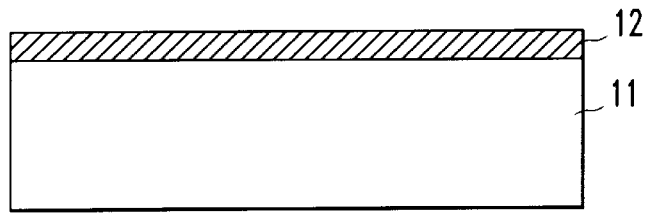
FIG. 2 is a front elevational view, in cross-section, of the substrate of FIG. 1 after growth thereon of a conductive plane.

The first step in the practice of the present invention involves selection of a suitable substrate material. Most of the optoelectronic devices currently manufactured are designed for long wavelength systems (1.3 and 1.55 micrometers) and are typically fabricated from indium gallium arsenide phosphide materials on indium phosphide substrates. However, in some cases aluminum gallium arsenide/gallium arsenide substrates are employed for short wavelength systems. The substrate chosen is normally n-doped. FIG. 1 depicts a typical semi-insulating n-type indium phosphide substrate member 11 in front elevational view.

Following, an n-type buffer layer (conducting plane) 12 is deposited upon the substrate 11 by conventional epitaxial growth techniques. This contact layer is required in those instances in which a semi-insulating substrate is used to provide the required conductivity. The epitaxial growth process preserves the crystalline symmetry of the substrate. Typical procedures suitable for this purpose include molecular beam epitaxy using only elemental sources or metal organic chemical vapor deposition using easily vaporized molecular sources.

Figure 3:
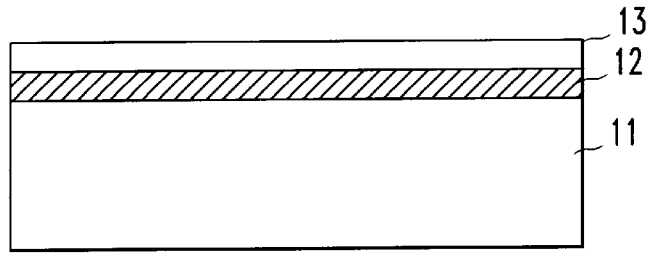
FIG. 3 is a front elevational view, in cross-section, of the structure of FIG. 2 after the growth thereon of a waveguide containing multiple quantum wells.

Next, there is deposited upon conducting plane 12 a waveguide 13, shown in FIG. 3. The waveguide selected for use in the practice of the present invention may be chosen from among any of the conventional prior art materials commonly used for this purpose and may comprise bulk materials or quantum well layers. The waveguide is grown in the base structure in an appropriate stoichiometry for achieving or propagating a particular wavelength suitable for waveguiding properties. The thickness of the waveguide is dictated by considerations relating to the optical mode desired.

Figure 4:
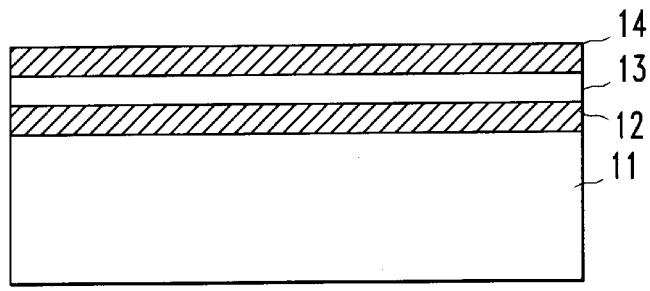
FIG. 4 is a front elevational view, in cross-section of the structure of FIG. 3 after growth thereon of a conductive plane on the waveguide.
Figure 5:
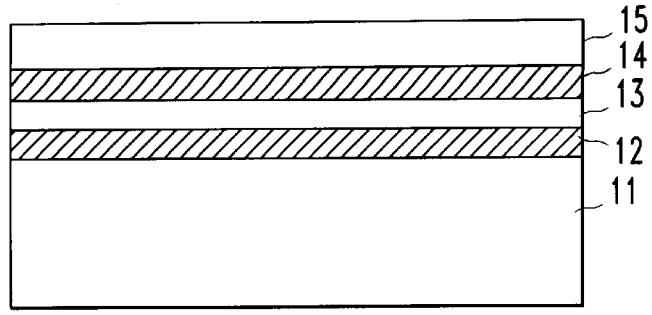
FIG. 5 is a front elevational view, in cross-section of the structure of FIG. 4 after the growth thereon of active quantum well laser layers.

Then, an n-type contact layer (conductive plane) 14 is deposited upon waveguide 13 as shown in FIG. 4. Thereafter, a laser 15 is deposited upon conductive layer 14, as shown in FIG. 5, by conventional epitaxial growth techniques. The laser is selected from among any of the materials commonly employed in distributed feedback (DFB) lasers and distributed Bragg reflector (DBR) lasers. Typical of such materials are the III–V semiconductor materials such as indium gallium arsenide phosphide.

The next step in the fabrication of the desired structure involves etching down the assembly to expose the waveguide materials. This end may be effected, for example, by anisotropic dry etching or low frequency plasma etching in which the direction of the ion bombardment enhances the etch rate. A variety of etchants may be chosen for this purpose. Typical etchants suitable for such use are HCl, Br:CH$_3$OH, H$_2$SO$_4$:H$_2$O$_2$ and HBr:H$_2$O$_2$ for wet etching and CF$_2$Cl$_2$, CH$_4$:H$_2$ and CH$_4$H$_2$ for dry etching.

Figure 6:
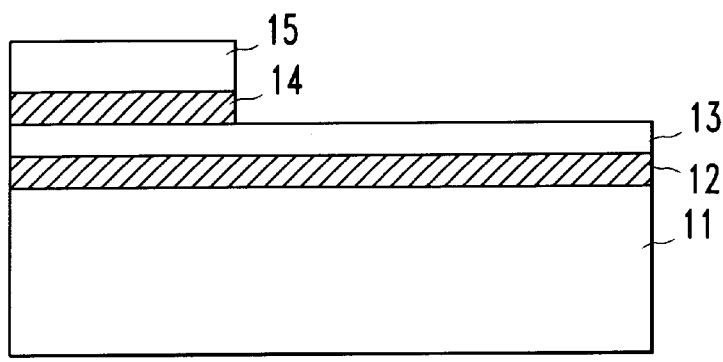
FIG. 6 is a front elevational view, in cross-section of the structure of FIG. 5 after removal of laser and conductive material in all areas but for the area destined for use as the gain region of the desired device.

Surface preparation is also critical in the preparation of contacts and to effect adhesion, so requiring reproducible surface preparation techniques. This typically involves multiple organic solvent cleaning followed by a light etch of the material, and the removal of surface oxides. The resultant etched down structure is shown in FIG. 6.

Figure 7:
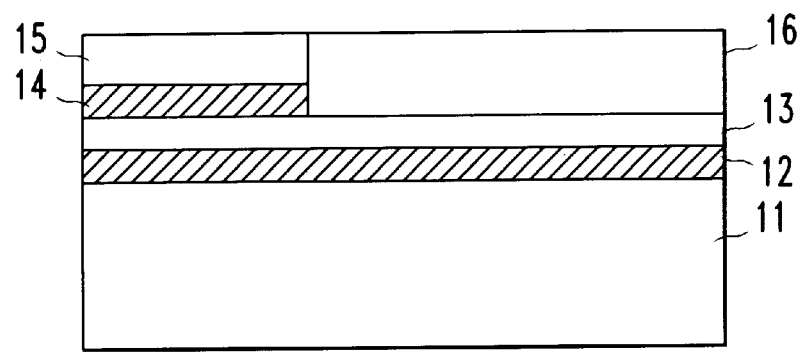
FIG. 7 is a front elevational view, in cross-section of the structure of FIG. 6 after the deposition thereon of cladding/spacer material.
Figure 8:
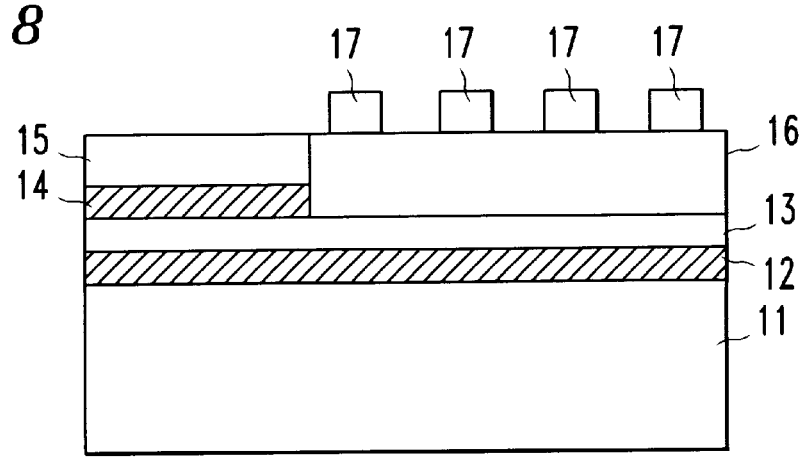
FIG. 8 is a front elevational view, in cross section of the structure of FIG. 7 after the formation thereon of an electro-optic grating and deposition of a conductive polymer film.
Figure 9:
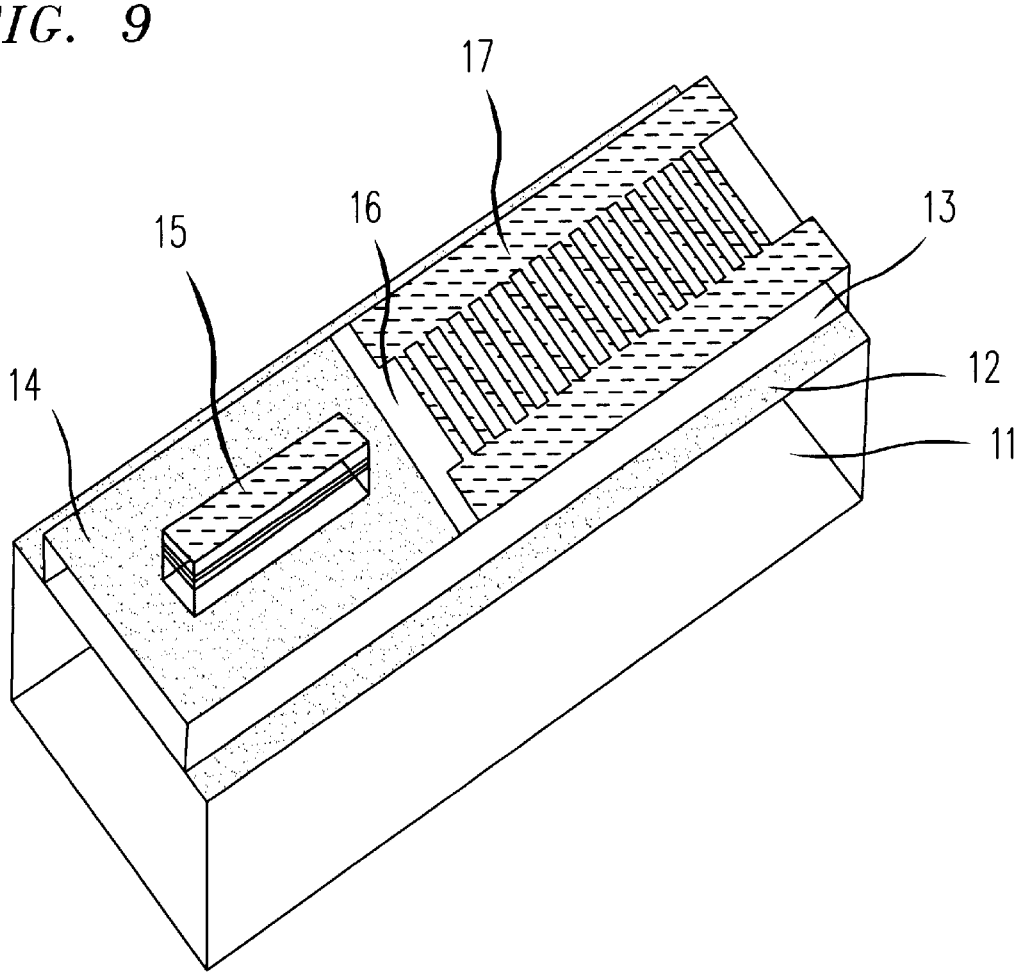
FIG. 9 is a front elevational view, in perspective, of the structure of FIG. 8.

Following the etching procedure in which the waveguide materials are exposed, cladding 16, as shown in FIG. 7, is deposited thereon. Then, a conductive material is deposited upon the cladding region 16 in the form of a grating 17 as shown in FIG. 8 by photolithographic techniques. A front elevational view, in perspective, of the structure of FIG. 8 is shown in FIG. 9.

The conductive material selected for use in the practice of the present invention may be chosen from among any of the conventional prior art materials used for this purpose and may comprise metals, semiconductors, or polymers. Polymer systems suitable for this purpose evidence metallic conductivity, are soluble, processable and environmentally stable. The most commonly used material for this purpose is polyaniline of the general formula:

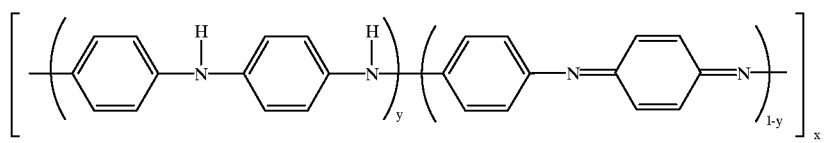

Of the various oxidative states of this material, the emeraldine form (y=0.5) has been the most widely used. This polymer, in the undoped form, is solution processable from both organic and aqueous acid solutions. The conductivity of the polyaniline does not degrade upon exposure to ambient conditions. Numerous derivatives of the material are also feasible since substituents such as alkyl groups can be easily incorporated on either the aromatic rings or the nitrogen atoms. This permits tailoring of the properties of the polyanilines.

Recent advances in the art have resulted in inducing doping of the polymer by incorporating onium salts or amine triflate salts in the polyaniline which decompose upon being subjected to radiation or thermal treatment to generate active dopant species, namely protonic acids.

The thickness and refractive index of the cladding/spacer layer for the conductive material is determined by the optical mode required and would be apparent to those skilled in the art.

The structures prepared in the described manner are suitable for use in a typical DBR laser system. The application of a difference of potential across the cladding periodically will result in the preparation of a grating of controlled refractive index, such control being attained by regulation of the voltage bias. The prime advantage of this technology resides in the substitution of conventional prior art gratings with an elctro-optic grating which enhances the lifetime of the device and improves the yield while reducing processing costs.

While the invention has been described in detail in the foregoing specification, it will be understood by those skilled in the art that variations may be made without departing from the spirit and scope of the invention.

What is claimed is:

1. Method for selective fabrication of a laser structure including a wavelength selective electro-optic grating which comprises the steps of:

(a) depositing a first n-type contact layer upon the surface of a semi-insulating or doped III–V semiconductor substrate;

(b) depositing a waveguide upon the n-type contact layer;

(c) depositing a second n-type contact layer upon the waveguide;

(d) depositing an active layer upon the said second n-type contact layer;

(e) selectively etching the active layer and the second n-type contact layer down to the waveguide layer in a region of the structure designed for formation of a grating;

(f) growing a cladding/spacer material upon said region designed for formation of a grating;

(g) depositing a conductive material on the resultant structure; and (h) patterning said conductive material to form electrodes in the shape of a grating.

2. Method in accordance with claim 1 wherein said substrate is indium phosphide.

3. Method in accordance with claim 1 wherein the waveguide comprises quantum well layers.

4. Method in accordance with claim 1 wherein the waveguide comprises bulk materials.

5. Method in accordance with claim 1 wherein the n-type contact layers are deposited by molecular beam epitaxy using elemental or organometallic sources.

6. Method in accordance with claim 1 wherein the n-type contact layers are deposited by metal organic chemical vapor deposition techniques.

7. A method of making a laser in accordance with claim 1 wherein the laser is selected from a group comprising DBR and DFB lasers.

8. Method in accordance with claim 1 wherein etching of the active layer is effected by anisotropic dry etching.

9. Method in accordance with claim 1 wherein said conductive material is polyaniline.

10. Method in accordance with claim 1 wherein the cladding comprises bulk materials.

11. Method in accordance with claim 1 wherein the cladding comprises quantum well layers.

* * * * *